United States Patent
Nakamura et al.

(10) Patent No.: US 11,646,333 B2
(45) Date of Patent: May 9, 2023

(54) IMAGING ELEMENT AND IMAGING DEVICE FOR IMPROVING ACCURACY OF POLARIZATION INFORMATION

(71) Applicant: SONY SEMICONDUCTOR SOLUTIONS CORPORATION, Kanagawa (JP)

(72) Inventors: Motoaki Nakamura, Kanagawa (JP); Motonari Honda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 368 days.

(21) Appl. No.: 16/769,577

(22) PCT Filed: Sep. 4, 2018

(86) PCT No.: PCT/JP2018/032769
§ 371 (c)(1),
(2) Date: Jun. 3, 2020

(87) PCT Pub. No.: WO2019/116646
PCT Pub. Date: Jun. 20, 2019

(65) Prior Publication Data
US 2021/0167108 A1   Jun. 3, 2021

(30) Foreign Application Priority Data
Dec. 14, 2017 (JP) .............................. JP2017-239220

(51) Int. Cl.
*H01L 27/146* (2006.01)
*G02B 5/30* (2006.01)

(52) U.S. Cl.
CPC ...... *H01L 27/14623* (2013.01); *G02B 5/3058* (2013.01); *H01L 27/14625* (2013.01)

(58) Field of Classification Search
CPC .................................. H01L 27/14623–14625
See application file for complete search history.

(56) References Cited

U.S. PATENT DOCUMENTS 11,003,048 B1 * 5/2021 Rawlani ............... A61B 5/0077
2010/0282945 A1   11/2010 Yokogawa
(Continued)

FOREIGN PATENT DOCUMENTS

CN   101887900 A   11/2010
CN   107615485 A   1/2018
(Continued)

OTHER PUBLICATIONS

International Search Report and Written Opinion of PCT Application No. PCT/JP2018/032769, dated Dec. 4, 2018, 10 pages of ISRWO.

*Primary Examiner* — Suberr L Chi
(74) *Attorney, Agent, or Firm* — Chip Law Group

(57) ABSTRACT

In an imaging element including a polarizer, accuracy of obtained polarization information is improved. The imaging element includes a polarizer and a photoelectric conversion element, from the incident light side. A plurality of types of polarizing members is arranged on the polarizer. The plurality of types of polarizing members is polarizing members having the same internal structures, and is formed as the plurality of types of polarizing members by rotationally moving or symmetrically moving one of the polarizing members. The photoelectric conversion element converts light incident through each of the plurality of types of polarizing members into electric charges.

18 Claims, 16 Drawing Sheets

(56) References Cited

U.S. PATENT DOCUMENTS

2014/0092227 A1\* 4/2014 Kanamori .......... A61B 1/00186
                                                              348/68
2018/0286908 A1\* 10/2018 Yamazaki ......... H01L 27/14645
2019/0148437 A1\* 5/2019 Cheng ................... G02B 5/201
                                                              257/432

FOREIGN PATENT DOCUMENTS

| | | |
|---|---|---|
| CN | 107924923 A | 4/2018 |
| CN | 108028259 A | 5/2018 |
| EP | 2252069 A2 | 11/2010 |
| JP | 2010-263158 A | 11/2010 |
| JP | 2017-005111 A | 1/2017 |
| JP | 2017-076683 A | 4/2017 |
| KR | 10-2010-0122058 A | 11/2010 |
| KR | 10-2018-0068953 A | 6/2018 |
| TW | 201106470 A | 2/2011 |
| WO | 2016/199594 A1 | 12/2016 |
| WO | 2017/018258 A1 | 2/2017 |
| WO | 2017/064844 A1 | 4/2017 |

\* cited by examiner

IMAGING ELEMENT AND IMAGING DEVICE FOR IMPROVING ACCURACY OF POLARIZATION INFORMATION

CROSS REFERENCE TO RELATED APPLICATIONS

This application is a U.S. National Phase of International Patent Application No. PCT/JP2018/032769 filed on Sep. 4, 2018, which claims priority benefit of Japanese Patent Application No. JP 2017-239220 filed in the Japan Patent Office on Dec. 14, 2017. Each of the above-referenced applications is hereby incorporated herein by reference in its entirety.

TECHNICAL FIELD

The present technology relates to an imaging element. More specifically, the present technology relates to an imaging element including a polarizer, and an imaging device.

BACKGROUND ART

An imaging device has conventionally been known that enables acquisition of polarization information. By using the polarization information, contrast of an image can be improved, or unnecessary information can be deleted. As an imaging device that acquires such polarization information, for example, an imaging device has been devised including a polarizing member using a wire grid (for example, see Patent Document 1).

CITATION LIST

Patent Document

Patent Document 1: Japanese Patent Application Laid-Open No. 2010-263158

SUMMARY OF THE INVENTION

Problems to be Solved by the Invention

In the conventional technology described above, a plurality of types of polarizing members having different polarization angles is provided on the photoelectric conversion element incident light side to acquire polarization information. However, in the conventional technology, since the polarizing members having different internal structures are combined, there is a possibility that a difference occurs in the characteristics of the polarization pixels, and accuracy of the obtained polarization information is degraded.

The present technology has been made in view of such a situation, and has an object to improve the accuracy of the obtained polarization information in an imaging element including a polarizer.

Solutions to Problems

The present technology has been made to solve the above-described problem, and a first aspect of the present technology is an imaging element including: a polarizer in which a plurality of types of polarizing members is arranged, the plurality of types of polarizing members each being obtained by rotationally moving or symmetrically moving one of the plurality of types of polarizing members having identical internal structures; and a photoelectric conversion element that converts light incident through each of the plurality of types of polarizing members into electric charges, and an imaging device including the imaging element. A function is therefore brought about of equalizing the characteristics of the polarization pixels, by using the plurality of types of polarizing members each being obtained by rotationally moving or symmetrically moving one of the plurality of types of polarizing members having identical internal structures.

Furthermore, in the first aspect, at least one type of the plurality of types of polarizing members may be obtained by at least symmetrically moving another type of the polarizing members. A function is therefore brought about of facilitating equalization of the characteristics of the polarization pixel.

Furthermore, in the first aspect, the plurality of types of polarizing members may include: a first type polarizing member; a second type polarizing member obtained by inverting horizontally and rotating clockwise by 90 degrees the first type polarizing member; a third type polarizing member obtained by rotating the first type polarizing member counterclockwise by 90 degrees; and a fourth type polarizing member obtained by inverting horizontally the first type polarizing member. At this time, a polarization angle of the first type polarizing member may be within a range of from 5 degrees to 40 degrees.

Furthermore, in the first aspect, the plurality of types of polarizing members may include: a first type polarizing member; a second type polarizing member obtained by rotating the first type polarizing member counterclockwise by 45 degrees; a third type polarizing member obtained by rotating the first type polarizing member counterclockwise by 90 degrees; and a fourth type polarizing member obtained by rotating the first type polarizing member counterclockwise by 135 degrees. In this case, area shapes of the plurality of types of polarizing members may be regular octagons or circles.

Furthermore, in the first aspect, a light-shielding film arranged in an area outside the plurality of types of polarizing members may be further included. A function is therefore brought about of preventing light from being incident on other than the polarizing member.

Furthermore, in the first aspect, lenses arranged on an incident side to be respectively inscribed in the plurality of types of polarizing members may be further included. A function is therefore brought about of causing the focused light to be efficiently incident on the polarizing member.

Furthermore, in the first aspect, the plurality of types of polarizing members may include: a first type polarizing member; a second type polarizing member obtained by rotating the first type polarizing member counterclockwise by 60 degrees; and a third type polarizing member obtained by rotating the first type polarizing member counterclockwise by 120 degrees. In this case, area shapes of the plurality of types of polarizing members may be regular hexagons.

Furthermore, in the first aspect, the plurality of types of polarizing members may include: a first type polarizing member; a second type polarizing member obtained by inverting horizontally and rotating clockwise by 120 degrees the first type polarizing member; a third type polarizing member obtained by rotating the first type polarizing member counterclockwise by 60 degrees; a fourth type polarizing member obtained by inverting horizontally and rotating clockwise by 60 degrees the first type polarizing member; a fifth type polarizing member obtained by rotating the first type polarizing member counterclockwise by 120 degrees;

and a sixth type polarizing member obtained by horizontally inverting the first type polarizing member.

Furthermore, in the first aspect, in the polarizer, each of the plurality of types of polarizing members may be arranged such that area shapes of the plurality of types of polarizing members are to overlap each other by parallel movement.

Furthermore, in the first aspect, when there are n types of angles of rotational movement in the plurality of types of polarizing members, area shapes of the plurality of types of polarizing members may be n×m polygons, where n and m are integers.

Furthermore, in the first aspect, the plurality of types of polarizing members may be wire grid type polarizing members each having a shape of a parallelogram and a plurality of linear conductive light-shielding material layers parallel to one side of the parallelogram. In this case, the plurality of linear conductive light-shielding material layers in the plurality of types of polarizing members is desirably parallel to a long side of the parallelogram. Furthermore, the plurality of types of polarizing members may each have a shape of a parallelogram in which lengths of respective sides are equal to each other, the parallelogram having a combination of interior angles of 60 degrees and 120 degrees. Furthermore, the plurality of types of polarizing members is at least three types of polarizing members.

Effects of the Invention

According to the present technology, an excellent effect can be achieved that the accuracy can be improved of the obtained polarization information, in the imaging element including the polarizer. Note that, the effect described here is not necessarily limited, and can be any effect described in the present disclosure.

MODE FOR CARRYING OUT THE INVENTION

The following is a description of a mode for carrying out the present technology (the mode will be hereinafter referred to as the embodiment). The description will be made in the following order.

1. Imaging device
2. First embodiment (example of four types of polarizing members by rotational movement and symmetrical movement)
3. Second embodiment (example of four types of polarizing members by rotational movement)
4. Third embodiment (example in which area shapes of polarizing members are regular octagons)
5. Fourth embodiment (example in which area shapes of polarizing members are circles)
6. Fifth embodiment (example of three types of polarizing members by rotational movement)
7. Sixth embodiment (example of six types of polarizing members by rotational movement and symmetrical movement)
8. Seventh embodiment (example in which area shapes of polarizing members are parallelograms)

1. Imaging Device

[Overall Configuration of Imaging Device]

Figure 1:
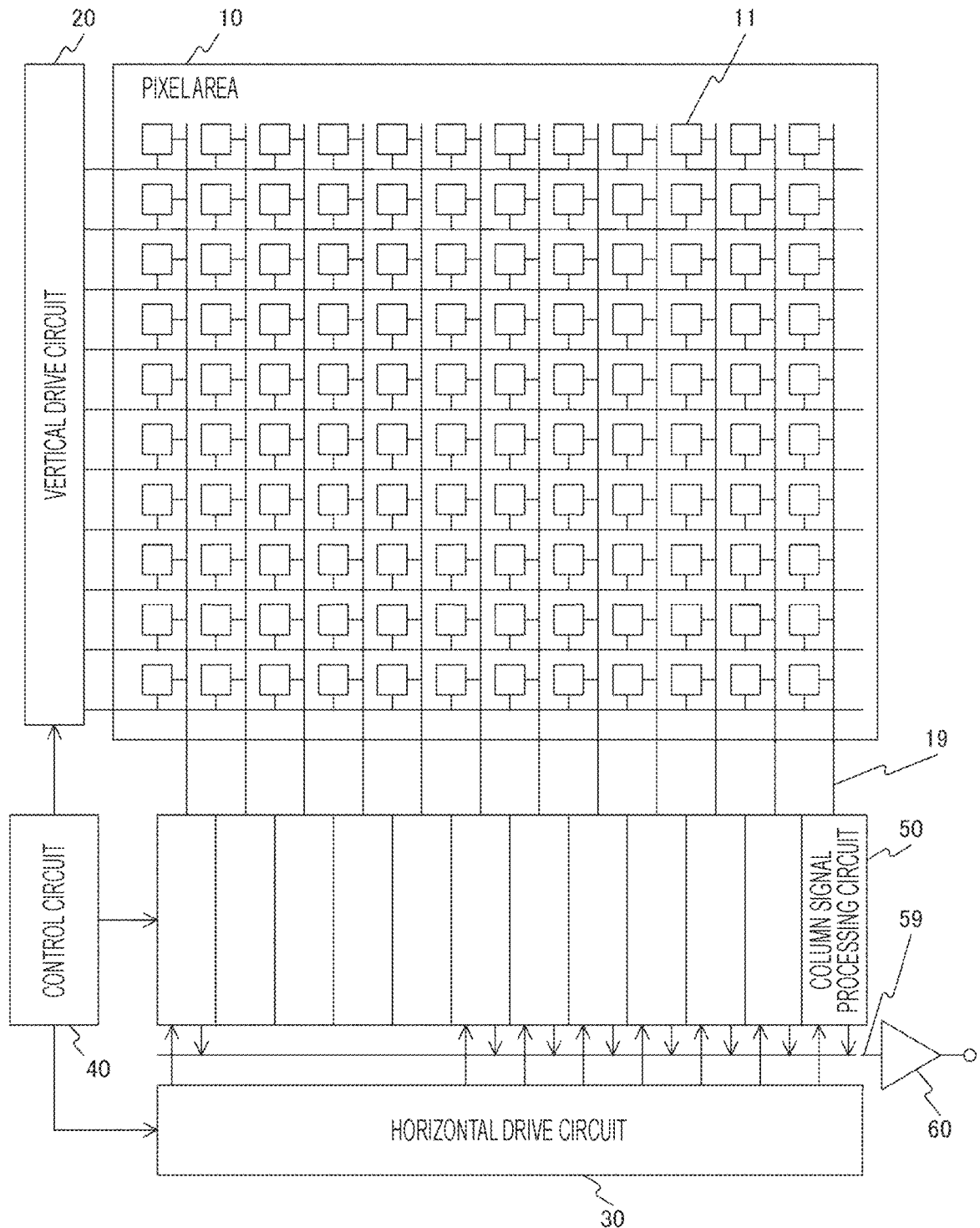
FIG. 1 is a diagram illustrating an example of an overall configuration of an imaging device in an embodiment of the present technology.

FIG. 1 is a diagram illustrating an example of an overall configuration of an imaging device in an embodiment of the present technology. The imaging device includes a pixel area 10 and a peripheral circuit unit. The peripheral circuit unit includes a vertical drive circuit 20, a horizontal drive circuit 30, a control circuit 40, a column signal processing circuit 50, and an output circuit 60.

The pixel area 10 is a pixel array in which a plurality of imaging elements 11 including a photoelectric conversion unit is arranged in a two-dimensional array. The imaging elements 11 each include, for example, a photodiode to be a photoelectric conversion unit, and a plurality of pixel transistors.

The vertical drive circuit 20 drives the imaging elements 11 on a row basis. The vertical drive circuit 20 includes a shift register, for example. The vertical drive circuit 20 selects a pixel drive wiring line and supplies a pulse for driving each of the imaging elements 11 to the selected pixel drive wiring line. The vertical drive circuit 20 therefore selectively scans the imaging elements 11 of the pixel area 10 sequentially in the vertical direction on a row basis, and supplies pixel signals based on signal charges generated depending on the amount of light received in the photoelectric conversion units of the imaging elements 11, to the column signal processing circuit 50 via a vertical signal line 19.

The horizontal drive circuit 30 drives the column signal processing circuit 50 on a column basis. The horizontal drive circuit 30 includes a shift register, for example. The horizontal drive circuit 30 selects each of a plurality of the column signal processing circuits 50 in order by sequentially outputting horizontal scanning pulses, and causes each of the column signal processing circuits 50 to output the pixel signals to the output circuit 60 via a horizontal signal line 59.

The control circuit 40 controls the entire imaging device. The control circuit 40 receives an input clock, and data for commanding an operation mode and the like, and outputs data such as internal information of the imaging device. In other words, the control circuit 40 generates a control signal and a clock signal to be a reference of operation of the vertical drive circuit 20, the column signal processing circuits 50, the horizontal drive circuit 30, and the like, on the basis of a vertical synchronization signal, a horizontal synchronization signal, and a master clock signal. Then, these signals are input to the vertical drive circuit 20, the column signal processing circuits 50, the horizontal drive circuit 30, and the like.

The column signal processing circuit 50 is arranged, for example, for each column of the imaging elements 11, and performs signal processing such as noise reduction for each pixel column on signals output from the imaging elements 11 for one row. In other words, the column signal processing circuit 50 performs signal processing such as correlated double sampling (CDS) for reducing fixed pattern noise inherent to the imaging elements 11, signal amplification, and analog to digital (AD) conversion. At the output stage of the column signal processing circuit 50, a horizontal selection switch (not illustrated) is connected between the column signal processing circuit 50 and the horizontal signal line 59.

The output circuit 60 performs signal processing on signals sequentially supplied through the horizontal signal line 59 from each of the column signal processing circuits 50, and outputs the signals. At that time, the output circuit 60 buffers the signals from the column signal processing circuits 50. Furthermore, the output circuit 60 may perform black level adjustment, column variation correction, various types of digital signal processing, and the like on the signals from the column signal processing circuits 50.

[Configuration of Imaging Element]

Figure 2:
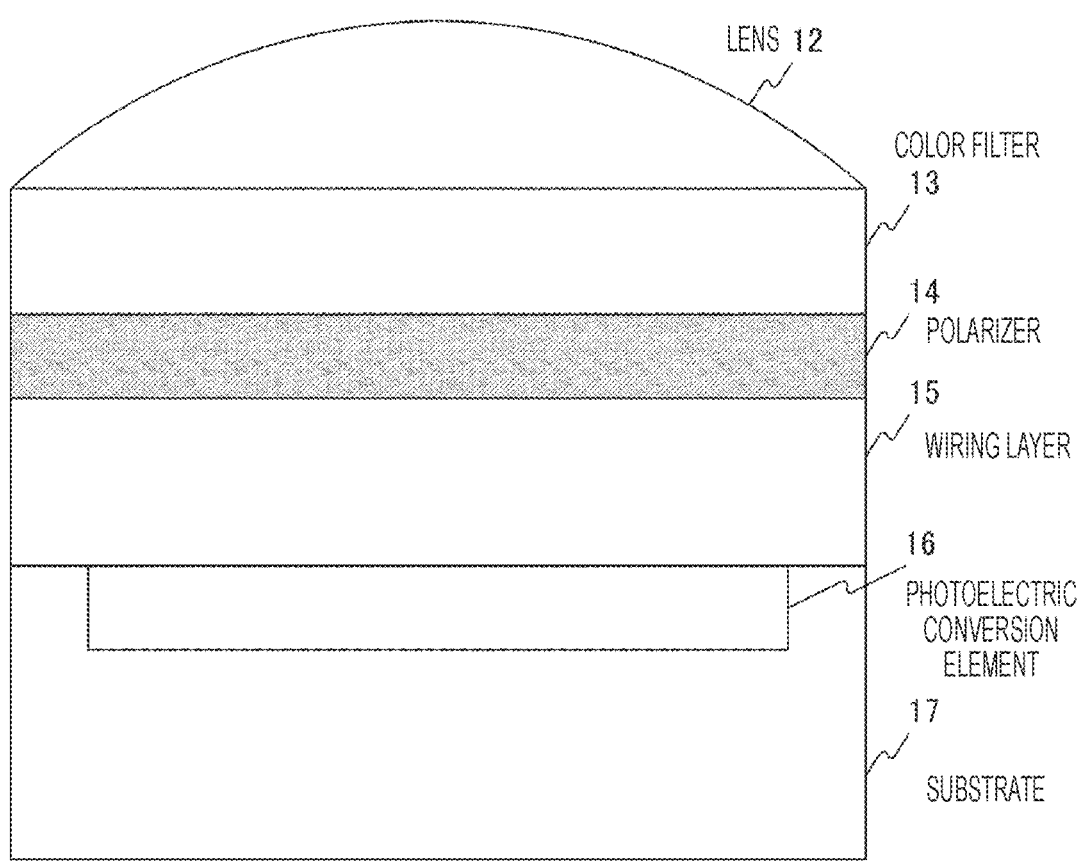
FIG. 2 is a diagram illustrating an example of a cross-sectional view of an imaging element 11 in the embodiment of the present technology.

FIG. 2 is a diagram illustrating an example of a cross-sectional view of the imaging element 11 in the embodiment of the present technology.

In this example, it is assumed that the imaging element 11 has a structure in which a lens 12, a color filter 13, a polarizer 14, a wiring layer 15, and a substrate 17 are stacked in this order from the incident light side. However, the structure is merely an example, and may be, for example, a back-illuminated structure in which light is emitted from a surface different from the wiring layer 15.

The lens 12 is a light focusing element provided for each imaging element 11. Incident light is focused by the lens 12 and taken into the imaging element 11.

The color filter 13 is a filter that transmits a specific wavelength range. For example, a filter is assumed that transmits red, blue, green, or the like. However, the color filter 13 is provided as needed, and can be omitted in a case where only polarization information is acquired.

The polarizer 14 is an element for acquiring polarization information. As the polarizing member used as the polarizer 14, for example, a wire grid type is used having a plurality of linear conductive light-shielding material layers. The light passing through the polarizer 14 is incident on the substrate 17 via the wiring layer 15.

The substrate 17 is a substrate on which a circuit of the imaging element 11 is formed. On the substrate 17, a photoelectric conversion element 16 is formed. The photoelectric conversion element 16 is an element that converts incident light into electric charges, and for example, a photodiode is used.

The wiring layer 15 is a region where a metal layer is formed that is a wiring between circuits formed on the substrate 17.

2. First Embodiment

Figure 3:
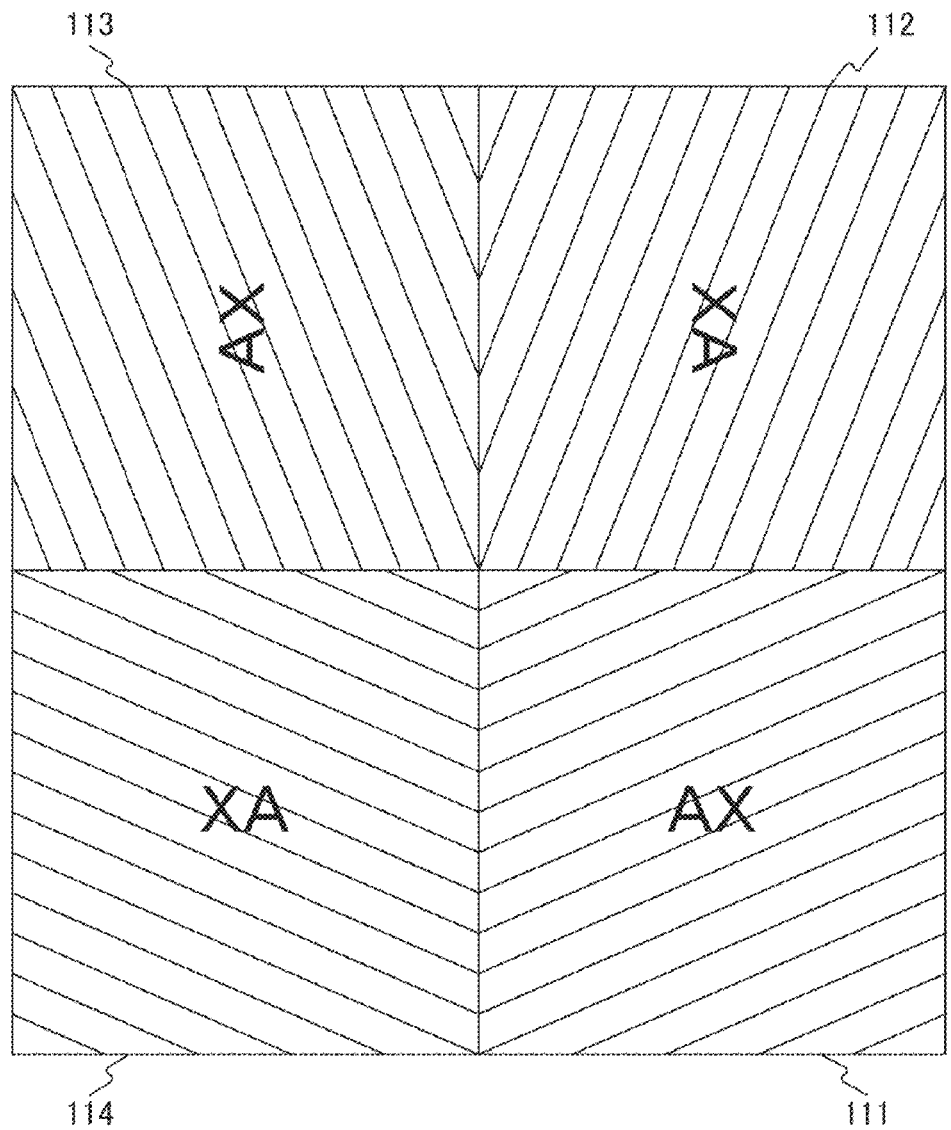
FIG. 3 is a top view illustrating an arrangement example of a polarizer 14 in a first embodiment of the present technology.

FIG. 3 is a top view illustrating an arrangement example of the polarizer 14 in a first embodiment of the present technology.

In the first embodiment, four types of polarizing members are formed by using square polarizing members having the same internal structures, and rotationally moving or symmetrically moving (inverting) one of the polarizing members. Assuming a wire grid type polarizing member, the internal structure of the polarizing member is determined by the length, pitch, and the like of the linear conductive light-shielding material layer (wire grid). The angle of the wire grid is the polarization angle. In this case, the length of the wire grid does not change even if polarizing member is rotationally moved or symmetrically moved. In other words, if the internal structures of the polarizing members are the same as each other, even if rotational movement or symmetrical movement is performed, only the polarization angle changes, and the characteristics as the polarizing member (for example, transmission axis transmittance, reflection axis transmittance, extinction ratio, and the like) are not expected to be affected.

In this example, four types of polarizing members are illustrated, a first type polarizing member 111, a second type polarizing member 112, a third type polarizing member 113, and a fourth type polarizing member 114. The polarizing members 111 to 114 all have the same internal structure. Furthermore, arrangement is made so that these polarizing members 111 to 114 are to overlap each other by the parallel movement. Note that, in this embodiment and some of the following embodiments, characters are attached so that the angle can be easily understood visually, but this is only a mark for explaining the rotational movement and the symmetrical movement, and these characters are not actually engraved.

With the first type polarizing member 111 as a reference, the second type polarizing member 112 is obtained by horizontally inverting the first type polarizing member 111, and rotating the inverted first type polarizing member 111 clockwise by 90 degrees. Furthermore, the third type polarizing member 113 is obtained by rotating the first type polarizing member 111 counterclockwise by 90 degrees. Furthermore, the fourth type polarizing member 114 is obtained by horizontally inverting the first type polarizing member 111.

In other words, these polarizing members 111 to 114 are formed by rotationally moving or symmetrically moving one of the polarizing members having the same internal structures. Furthermore, at least one type of the polarizing members (in this example, the second type polarizing member 112 and the fourth type polarizing member 114) is formed by at least symmetrically moving another type of the polarizing members (in this example, the first type polarizing member 111).

Figure 4:
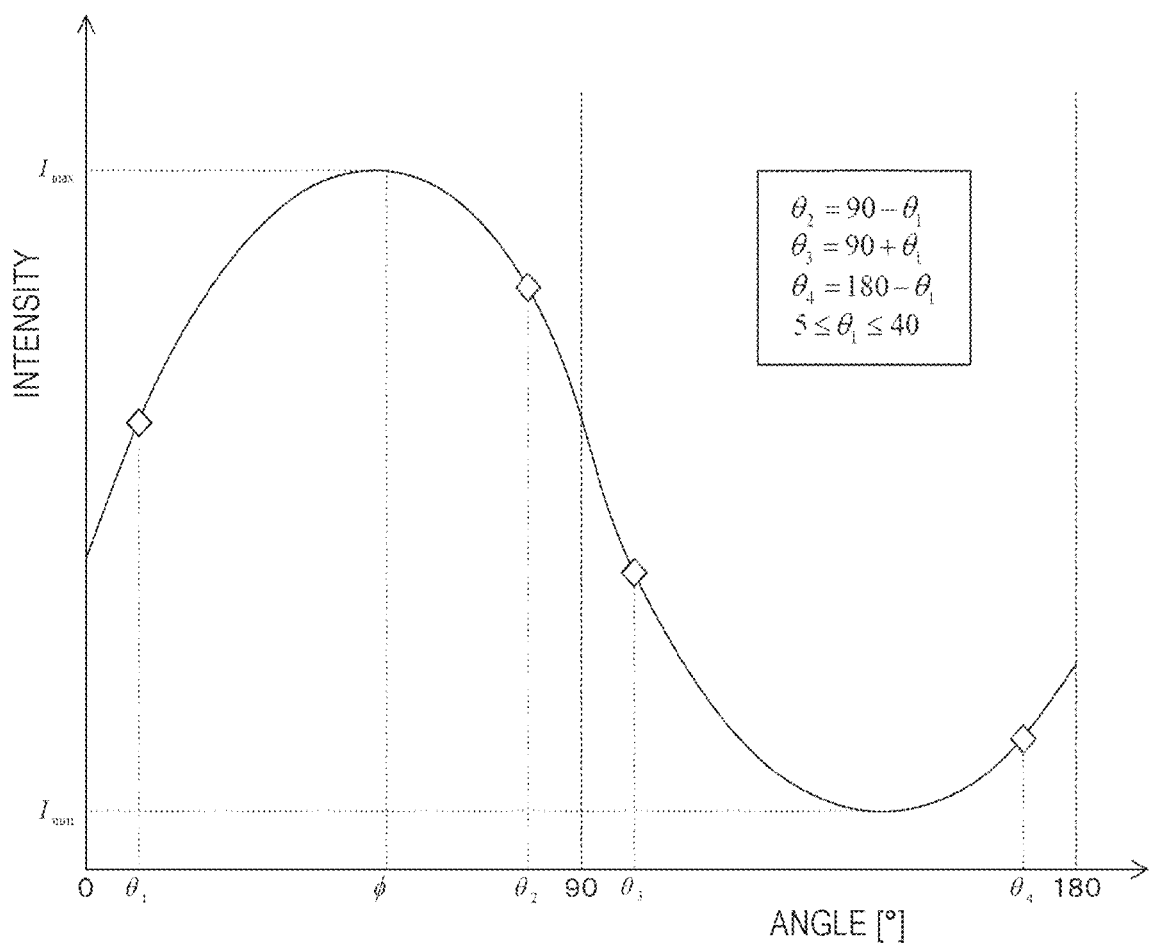
FIG. 4 is a diagram illustrating an example of a relationship between a sine function and a polarization direction of the polarizer 14 in the first embodiment of the present technology.

FIG. 4 is a diagram illustrating an example of a relationship between a sine function and a polarization direction of the polarizer 14 in the first embodiment of the present technology.

The polarization angles of the four types of polarizing members 111 to 114 are denoted by $\theta_1$ to $\theta_4$, respectively. These four types of polarization angles $\theta_1$ to $\theta_4$ are plotted in the horizontal axis direction, the corresponding pixel output values are plotted in the vertical direction, and fitting is performed to a sine function (or cosine function). As a result, polarization information (the degree of polarization and the polarization angle) of incident light can be obtained by obtaining an angle φ at which the pixel output value indicates a maximum value Imax. As described above, at least three types of polarizer angles are required to perform fitting to a sine function or the like to obtain polarization information. Thus, polarization information can be obtained with four types of pixels as in this example; however, for example, polarization information cannot be correctly obtained with two types of pixels.

In the first embodiment, the polarization angles $\theta_1$ to $\theta_4$ of the four types of polarizing members 111 to 114 have a relationship of $$\theta_2=90-\theta_1$$

$$\theta_3=90+\theta_1$$

$$\theta_4=180-\theta_1.$$

However, when the polarization angle $\theta_1$ of the first type polarizing member 111 approaches 0 degrees or 45 degrees, the polarization angles of the two types of pixels become substantially the same as each other, and as a result, only two types of pixels are obtained. Thus, it is assumed that the polarization angle $\theta_1$ of the first type polarizing member 111 is within a range of from 5 degrees to 40 degrees as indicated below.

$$5 \leq \theta_1 \leq 40$$

At this time, the polarization angle $\theta_1$ is more desirably the median value 22.5 degrees.

As described above, according to the first embodiment of the present technology, by using four types of polarizing members obtained by rotationally moving or symmetrically moving one of the square polarizing members having the same internal structures, the characteristics as the polarizing member can be matched with each other, and highly accurate polarization information can be obtained. In other words, in an imaging element in which a plurality of types of polarizing members having different angles is arranged, the plurality of types of polarizing members are all equal in principle in the transmission axis transmittance, the reflection axis transmittance, and the extinction ratio. The accuracy is therefore improved of the maximum value, the minimum value, and the angle at which the maximum value is obtained of the sine function derived from a plurality of types of pixel outputs. Thus, the accuracy can be improved of the degree of polarization of light obtained by calculating the maximum value, minimum value, and angle at which the maximum value is obtained of the sine function, the azimuth angle and zenith angle of the object normal, and distance information and shape information of an object calculated on the basis of the azimuth angle and zenith angle.

3. Second Embodiment

Figure 5:
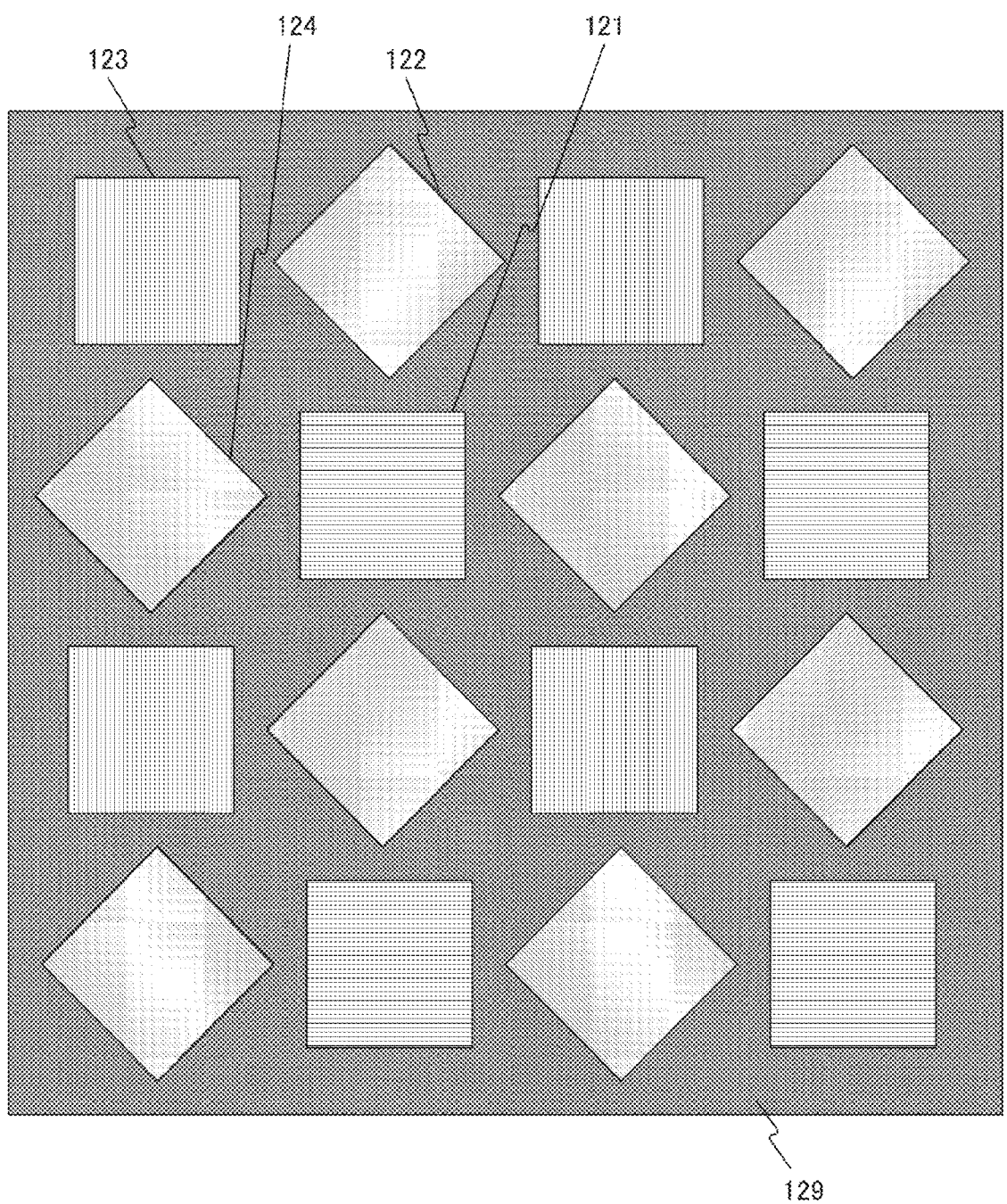
FIG. 5 is a top view illustrating an arrangement example of the polarizer 14 in a second embodiment of the present technology.

FIG. 5 is a top view illustrating an arrangement example of the polarizer 14 in a second embodiment of the present technology.

In the second embodiment, four types of polarizing members 121 to 124 are formed by using square polarizing members having the same internal structures, and rotationally moving one of the polarizing members.

With the first type polarizing member 121 as a reference, the second type polarizing member 122 is obtained by rotating the first type polarizing member 121 counterclockwise by 45 degrees. Furthermore, the third type polarizing member 123 is obtained by rotating the first type polarizing member 121 counterclockwise by 90 degrees. Furthermore, the fourth type polarizing member 124 is obtained by rotating the first type polarizing member 121 counterclockwise by 135 degrees. Four types of pixels can therefore be formed in which polarizing members are arranged being the same as each other in transmittance but different in only angles.

In a case where gaps are formed between the polarizing members 121 to 124 as in the second embodiment, it is desirable to arrange the light-shielding film 129 outside the polarizing members 121 to 124. Light can therefore be prevented from being incident on other than the polarizing members 121 to 124.

Figure 6:
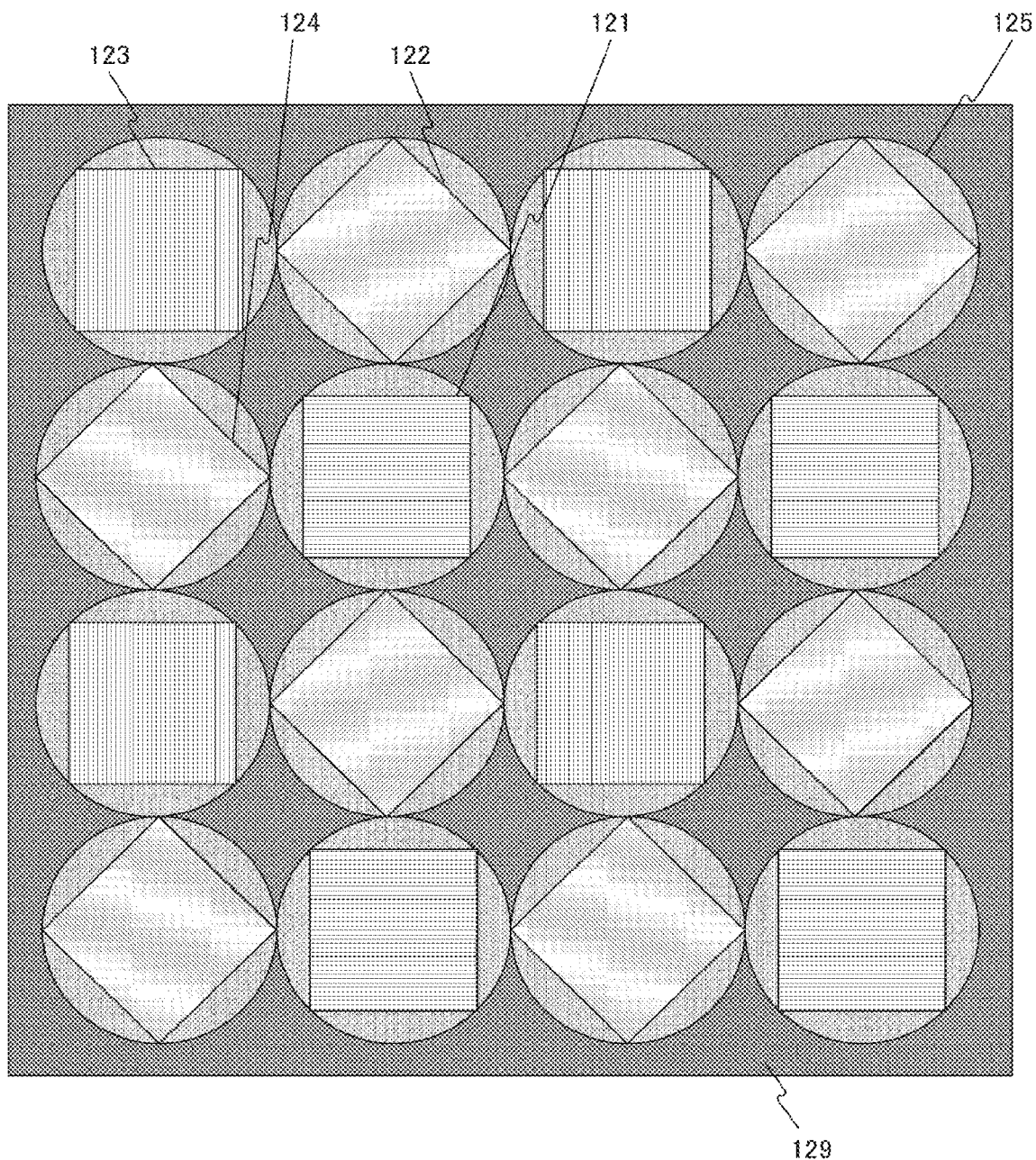
FIG. 6 is a top view illustrating another arrangement example of the polarizer 14 in the second embodiment of the present technology.

FIG. 6 is a top view illustrating another arrangement example of the polarizer 14 in the second embodiment of the present technology.

In this example, a lens 125 is arranged on the upper surface of each of the polarizing members 121 to 124. The lens 125 corresponds to the lens 12 illustrated in the above-described cross-sectional view. In a case where the lens 125 is provided, each of the polarizing members 121 to 124 is desirably arranged to be inscribed in the lens 125. Therefore, the lenses 125 are arranged on the incident side to be respectively inscribed in the polarizing members 121 to 124, and the focused light can be efficiently incident on the polarizing members 121 to 124.

As described above, according to the second embodiment of the present technology, by using four types of polarizing members obtained by rotationally moving one of the square polarizing members having the same internal structures, the characteristics as the polarizing member can be matched with each other, and highly accurate polarization information can be obtained.

4. Third Embodiment

Figure 7:
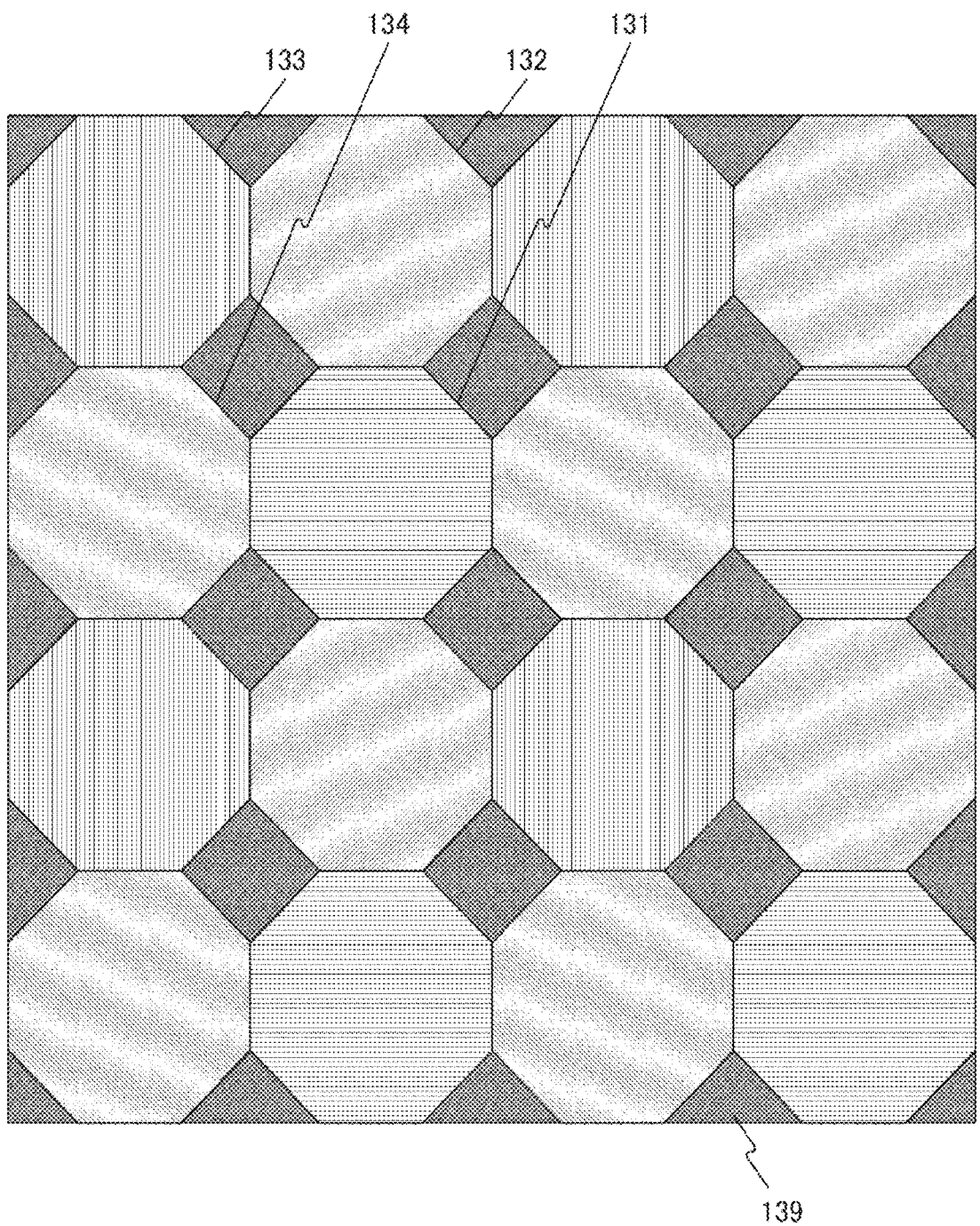
FIG. 7 is a top view illustrating an arrangement example of the polarizer 14 in a third embodiment of the present technology.

FIG. 7 is a top view illustrating an arrangement example of the polarizer 14 in a third embodiment of the present technology.

In the third embodiment, four types of polarizing members 131 to 134 are formed by using regular octagonal polarizing members having the same internal structures, and rotationally moving one of the polarizing members. Arrangement is made so that these polarizing members 131 to 134 are to overlap each other by parallel movement. In particular, in the third embodiment, the aperture ratio of the imaging element can be increased by making the shapes of the polarizing members regular octagons.

With the first type polarizing member 131 as a reference, the second type polarizing member 132 is obtained by rotating the first type polarizing member 131 counterclockwise by 45 degrees. Furthermore, the third type polarizing member 133 is obtained by rotating the first type polarizing member 131 counterclockwise by 90 degrees. Furthermore, the fourth type polarizing member 134 is obtained by rotating the first type polarizing member 131 counterclockwise by 135 degrees. Four types of pixels can therefore be formed in which polarizing members are arranged being the same as each other in transmittance but different in only angles.

In a case where gaps are formed between the polarizing members 131 to 134 as in the third embodiment, it is desirable to arrange the light-shielding film 139 outside the polarizing members 131 to 134. Light can therefore be prevented from being incident on other than the polarizing members 131 to 134.

Figure 8:
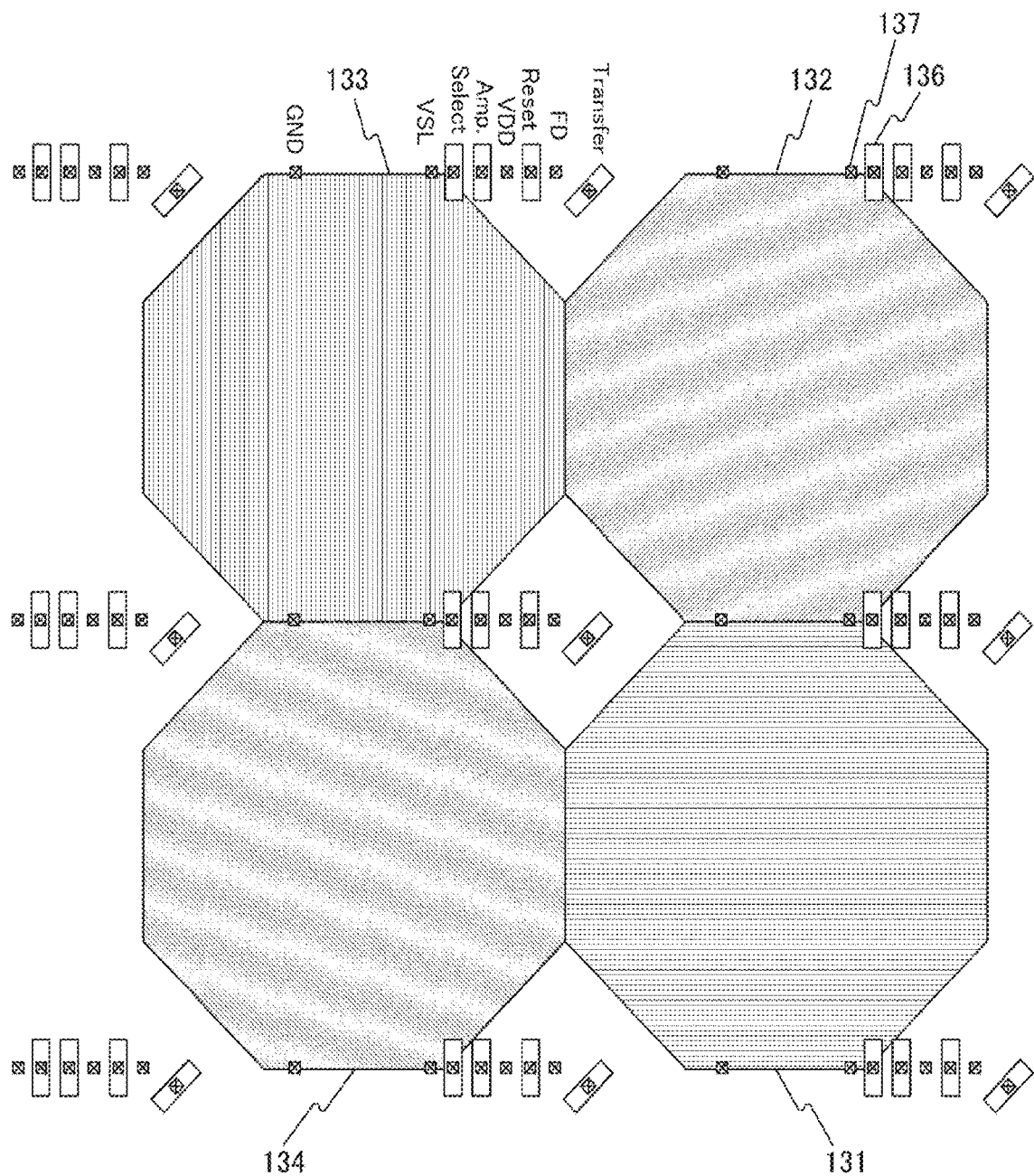
FIG. 8 is a diagram illustrating an example of an arrangement layout of the polarizer 14 in the third embodiment of the present technology.

FIG. 8 is a diagram illustrating an example of an arrangement layout of the polarizer 14 in the third embodiment of the present technology.

In this example, in addition to the polarizing members 131 to 134, a transistor 136 and a contact 137 on the substrate 17 are illustrated. As illustrated here, generally, in the pixel layout, the arrangement of transistors and the arrangement of wiring are translationally symmetrical. In the third embodiment, by making the area shapes of the polarizing members regular octagons, the area shape of each polarizing member can be made translationally symmetrical. Therefore, the optical properties of the four pixels other than the polarization angles can be equalized.

Figure 9:
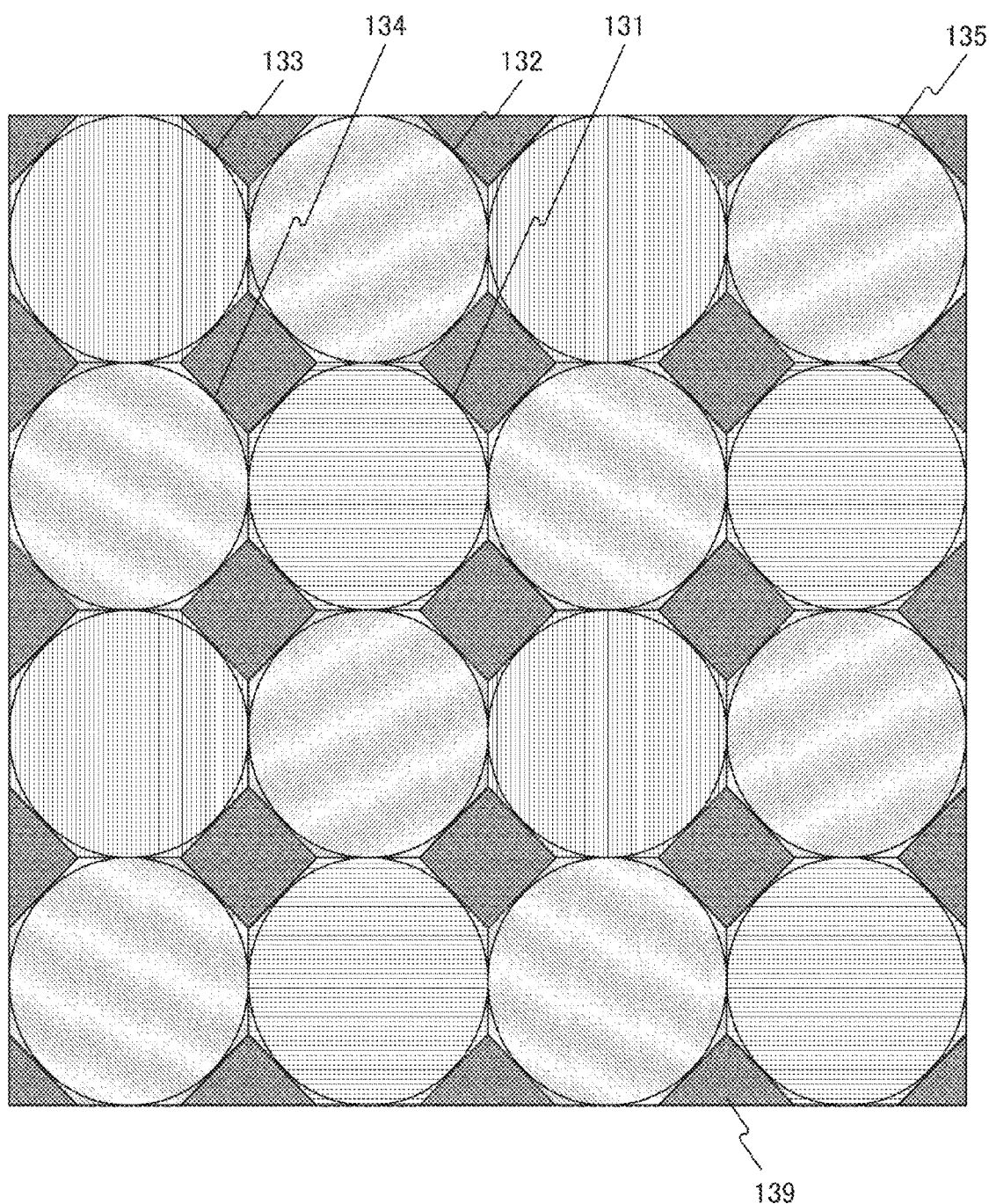
FIG. 9 is a top view illustrating another arrangement example of the polarizer 14 in the third embodiment of the present technology.

FIG. 9 is a top view illustrating another arrangement example of the polarizer 14 in the third embodiment of the present technology.

In this example, a lens 135 is arranged on the upper surface of each of the polarizing members 131 to 134. The lens 135 corresponds to the lens 12 illustrated in the above-described cross-sectional view. In a case where the lens 135 is provided, the lens 135 is desirably arranged to be inscribed in each of the polarizing members 131 to 134. Therefore, the lenses 135 are arranged on the incident side to be respectively inscribed in the polarizing members 131 to 134, and the focused light can be efficiently incident on the polarizing members 131 to 134.

As described above, according to the third embodiment of the present technology, by using four types of polarizing members obtained by rotationally moving one of the regular octagonal polarizing members having the same internal structures, the characteristics as the polarizing member can be matched with each other, and highly accurate polarization information can be obtained.

5. Fourth Embodiment

Figure 10:
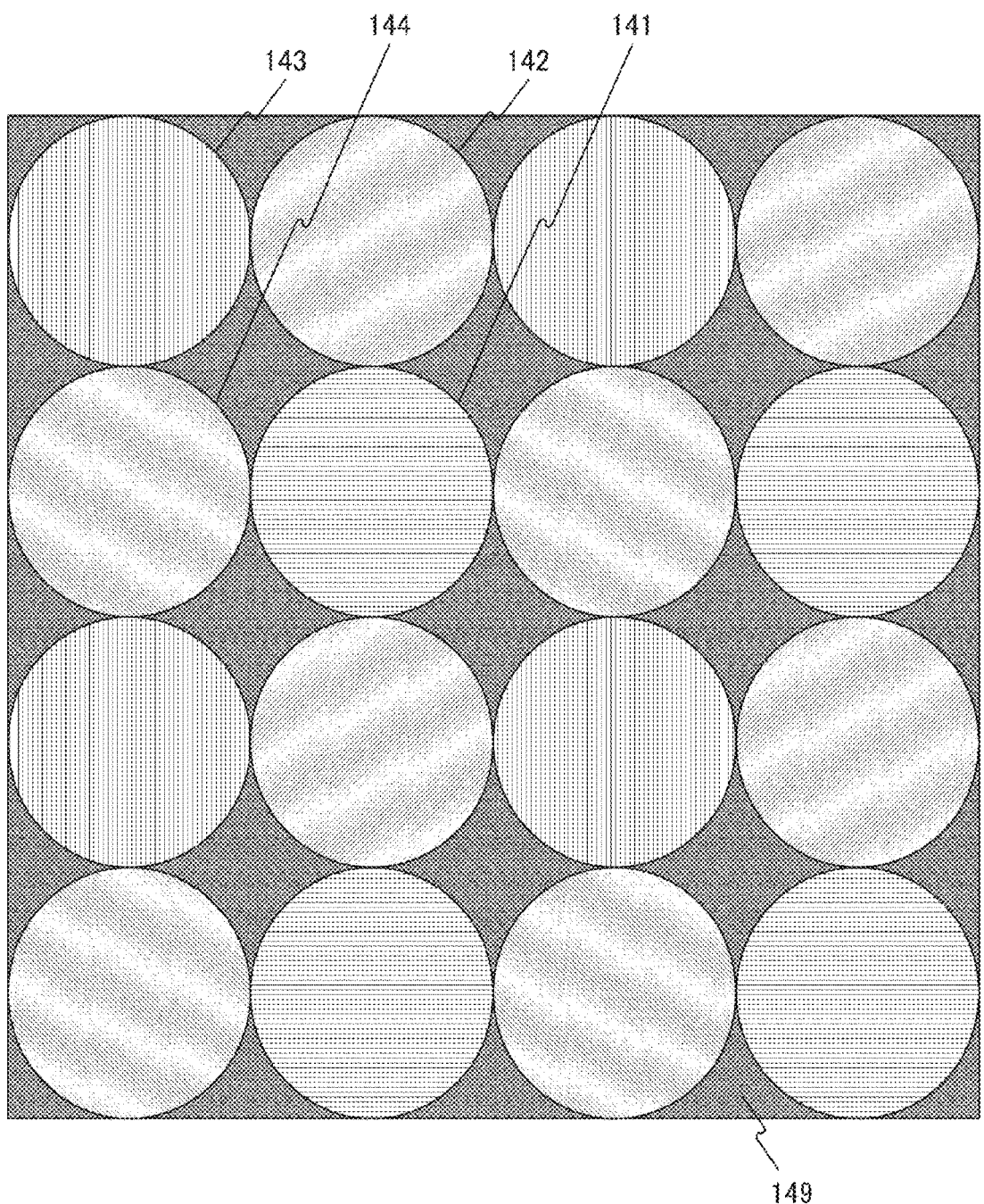
FIG. 10 is a top view illustrating an arrangement example of the polarizer 14 in a fourth embodiment of the present technology.

FIG. 10 is a top view illustrating an arrangement example of the polarizer 14 in a fourth embodiment of the present technology.

In the fourth embodiment, four types of polarizing members 141 to 144 are formed by using circular polarizing members having the same internal structures, and rotationally moving one of the polarizing members.

With the first type polarizing member 141 as a reference, the second type polarizing member 142 is obtained by rotating the first type polarizing member 141 counterclockwise by 45 degrees. Furthermore, the third type polarizing member 143 is obtained by rotating the first type polarizing member 141 counterclockwise by 90 degrees. Furthermore, the fourth type polarizing member 144 is obtained by rotating the first type polarizing member 141 counterclockwise by 135 degrees. Four types of pixels can therefore be formed in which polarizing members are arranged having the same optical properties other than the polarization angle of each pixel, and the same transmittance.

In a case where gaps are formed between the polarizing members 141 to 144 as in the fourth embodiment, it is desirable to arrange the light-shielding film 149 outside the polarizing members 141 to 144. Light can therefore be prevented from being incident on other than the polarizing members 141 to 144.

As described above, according to the fourth embodiment of the present technology, by using four types of polarizing members obtained by rotationally moving one of the circular polarizing members having the same internal structures, the characteristics as the polarizing member can be matched with each other, and highly accurate polarization information can be obtained.

6. Fifth Embodiment

Figure 11:
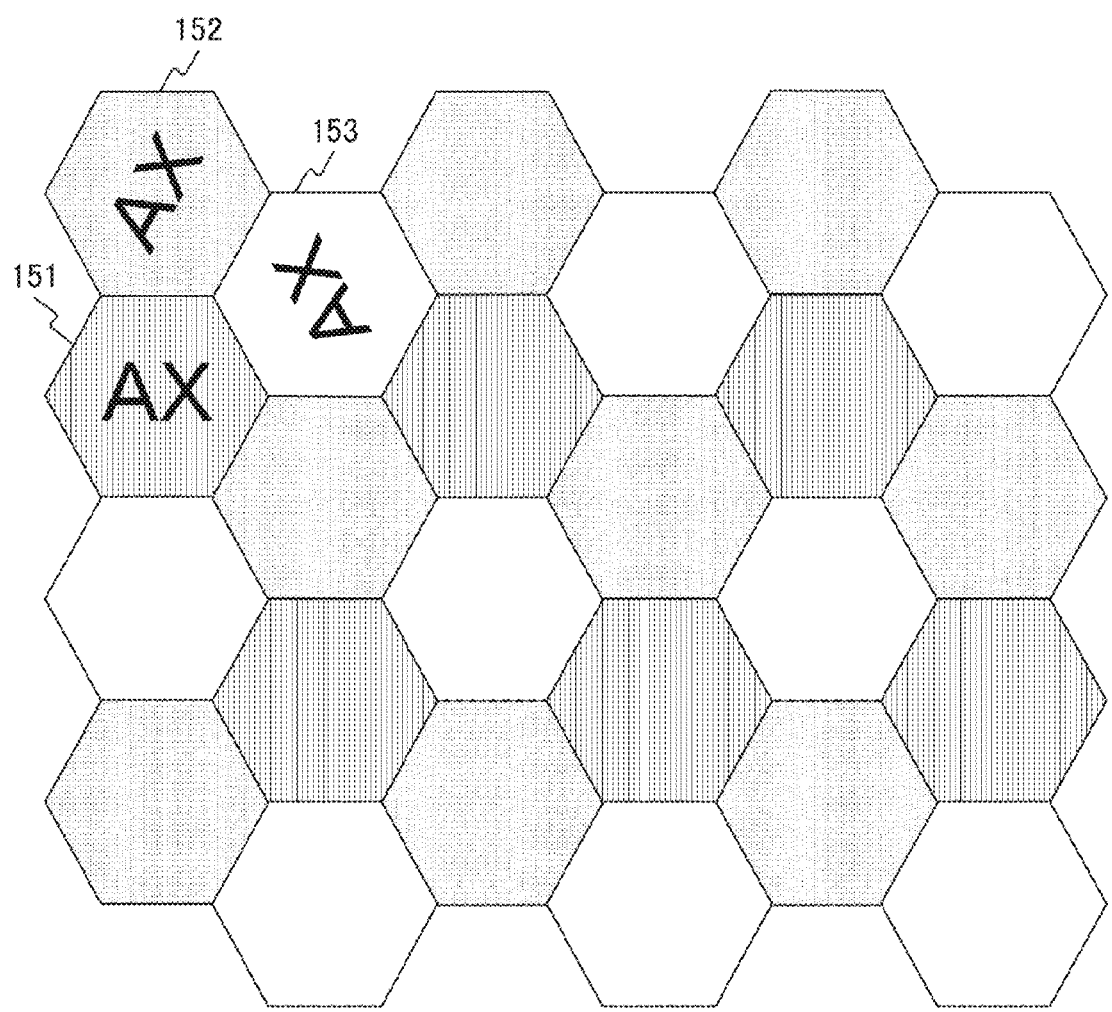
FIG. 11 is a top view illustrating an arrangement example of the polarizer 14 in a fifth embodiment of the present technology.

FIG. 11 is a top view illustrating an arrangement example of the polarizer 14 in a fifth embodiment of the present technology.

In the fifth embodiment, three types of polarizing members 151 to 153 are formed by using regular hexagonal polarizing members having the same internal structures, and rotationally moving one of the polarizing members. As described above, polarization information can be acquired if there are polarizing members of three types of different angles.

With the first type polarizing member 151 as a reference, the second type polarizing member 152 is obtained by rotating the first type polarizing member 151 counterclockwise by 60 degrees. Furthermore, the third type polarizing member 153 is obtained by rotating the first type polarizing member 151 counterclockwise by 120 degrees. Note that, the area shapes of the second type polarizing member 152 and the third type polarizing member 153 are the same as the area shape of the first type polarizing member 151.

In the fifth embodiment, the imaging elements are arranged in a honeycomb arrangement, and no gap is formed between the polarizing members 151 to 153.

As described above, according to the fifth embodiment of the present technology, by using three types of polarizing members obtained by rotationally moving one of the regular hexagonal polarizing members having the same internal structures, the characteristics as the polarizing member can be matched with each other, and highly accurate polarization information can be obtained.

7. Sixth Embodiment

Figure 12:
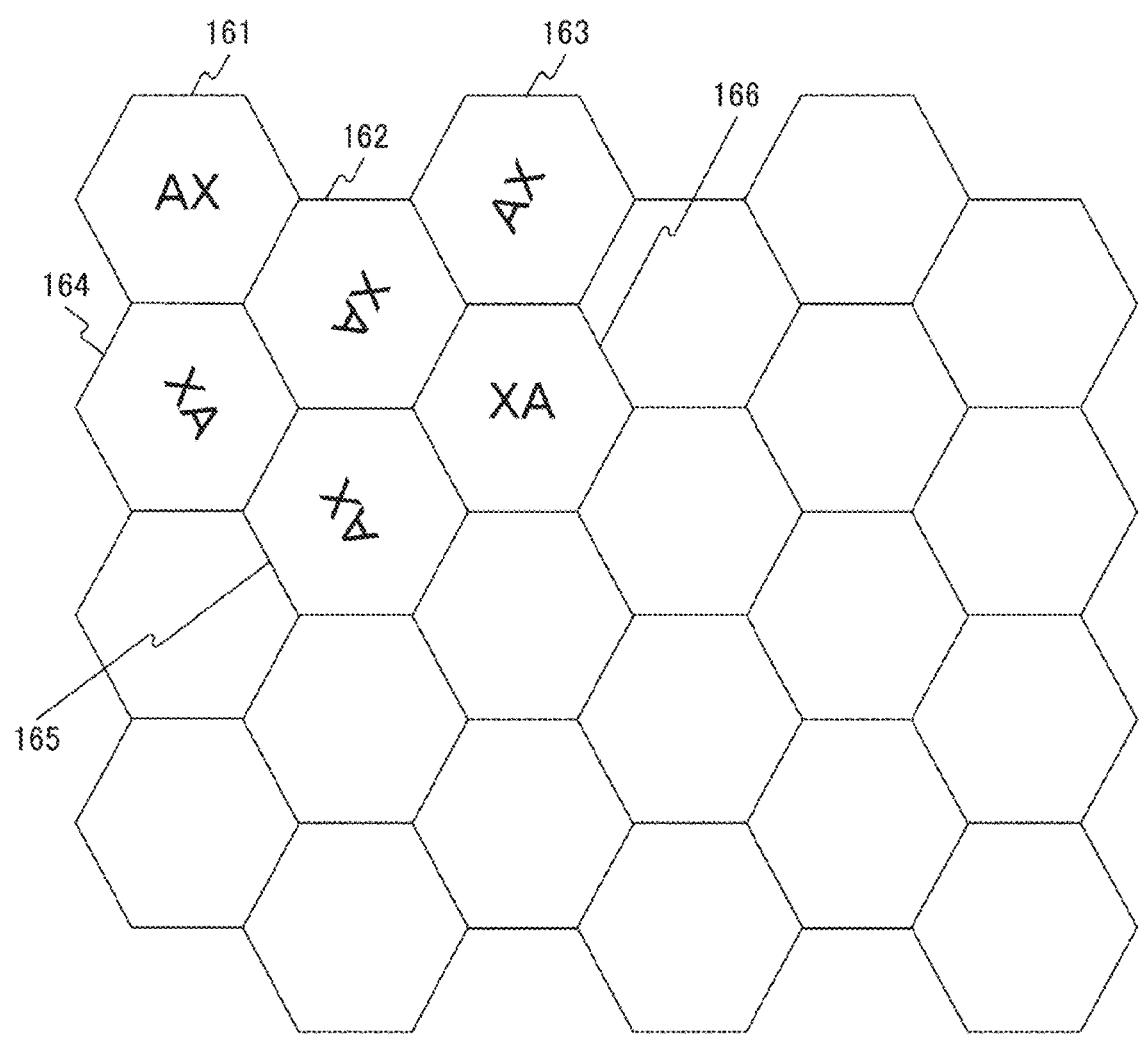
FIG. 12 is a top view illustrating an arrangement example of the polarizer 14 in a sixth embodiment of the present technology.

FIG. 12 is a top view illustrating an arrangement example of the polarizer 14 in a sixth embodiment of the present technology.

In the sixth embodiment, six types of polarizing members 161 to 166 are formed by using regular hexagonal polarizing members having the same internal structures, and rotationally moving or symmetrically moving (inverting) one of the polarizing members.

With the first type polarizing member 161 as a reference, the second type polarizing member 162 is obtained by horizontally inverting the first type polarizing member 161, and rotating the inverted second type polarizing member 162 clockwise by 120 degrees. Furthermore, the third type polarizing member 163 is obtained by rotating the first type polarizing member 161 counterclockwise by 60 degrees.

Furthermore, the fourth type polarizing member 164 is obtained by horizontally inverting the first type polarizing member 161, and rotating the inverted first type polarizing member 161 clockwise by 60 degrees. Furthermore, the fifth type polarizing member 165 is obtained by rotating the first type polarizing member 161 counterclockwise by 120 degrees. Furthermore, the sixth type polarizing member 166 is obtained by horizontally inverting the first type polarizing member 161.

In the first embodiment, the polarization angles $\theta_1$ to $\theta_6$ of the six types of polarizing members 161 to 166 have a relationship of $$\theta_2 = 60 - \theta_1$$

$$\theta_3 = 60 + \theta_1$$

$$\theta_4 = 120 - \theta_1$$

$$\theta_5 = 120 + \theta_1$$

$$\theta_6 = 180 - \theta_1.$$

However, when the polarization angle $\theta_1$ of the first type polarizing member 161 approaches 0 degrees or 30 degrees, the polarization angles of the two types of pixels become substantially the same as each other, and as a result, only three types of pixels are obtained. Thus, it is assumed that the polarization angle $\theta_1$ of the first type polarizing member 161 is within a range of from 5 degrees to 25 degrees as indicated below.

$$5 \leq \theta_1 \leq 25$$

At this time, the polarization angle $\theta_1$ is more desirably the median value 15 degrees.

As described above, according to the sixth embodiment of the present technology, by using six types of polarizing members obtained by rotationally moving or symmetrically moving one of the regular hexagonal polarizing members having the same internal structures, the characteristics as the polarizing member can be matched with each other, and highly accurate polarization information can be obtained.

8. Seventh Embodiment

Figure 13:
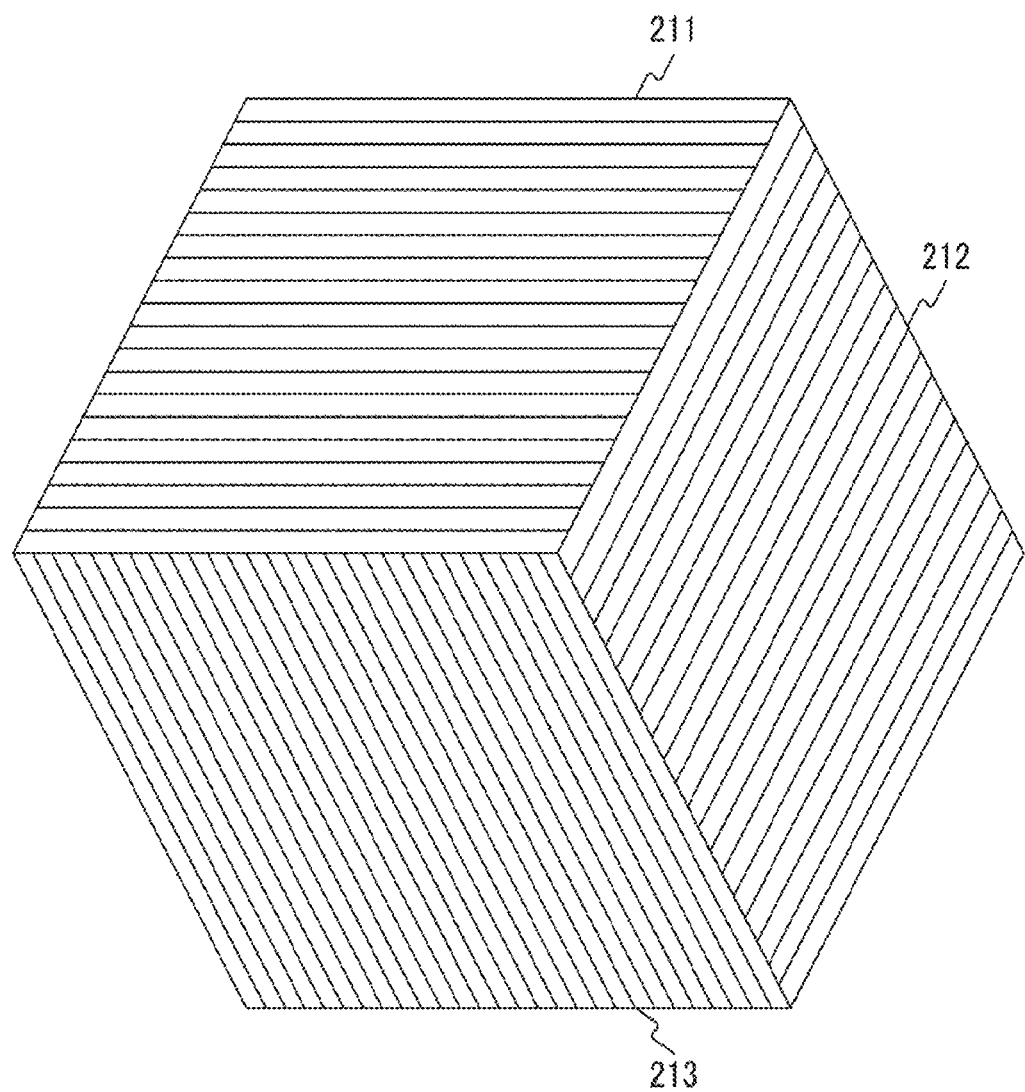
FIG. 13 is a top view illustrating a first arrangement example of the polarizer 14 in a seventh embodiment of the present technology.

FIG. 13 is a top view illustrating a first arrangement example of the polarizer 14 in a seventh embodiment of the present technology.

In the first arrangement example of the seventh embodiment, three types of polarizing members 211 to 213 are formed by using parallelogram-shaped polarizing members having the same internal structures, and rotationally moving one of the polarizing members. Assuming a wire grid type polarizing member, in the seventh embodiment, the linear conductive light-shielding material layer (wire grid) is formed parallel to any one side of the parallelogram.

With the first type polarizing member 211 as a reference, the second type polarizing member 212 is obtained by rotating the first type polarizing member 211 counterclockwise by 60 degrees. Furthermore, the third type polarizing member 213 is obtained by rotating the first type polarizing member 211 clockwise by 60 degrees.

In the first arrangement example, sides of the parallelogram are equal to each other, and has a rhombic shape. Furthermore, the angles of the interior angles are a combination of 60 degrees and 120 degrees. Therefore, the three types of polarizing members 211 to 213 can be densely arranged, and no gap is generated between the three types of polarizing members 211 to 213.

Figure 14:
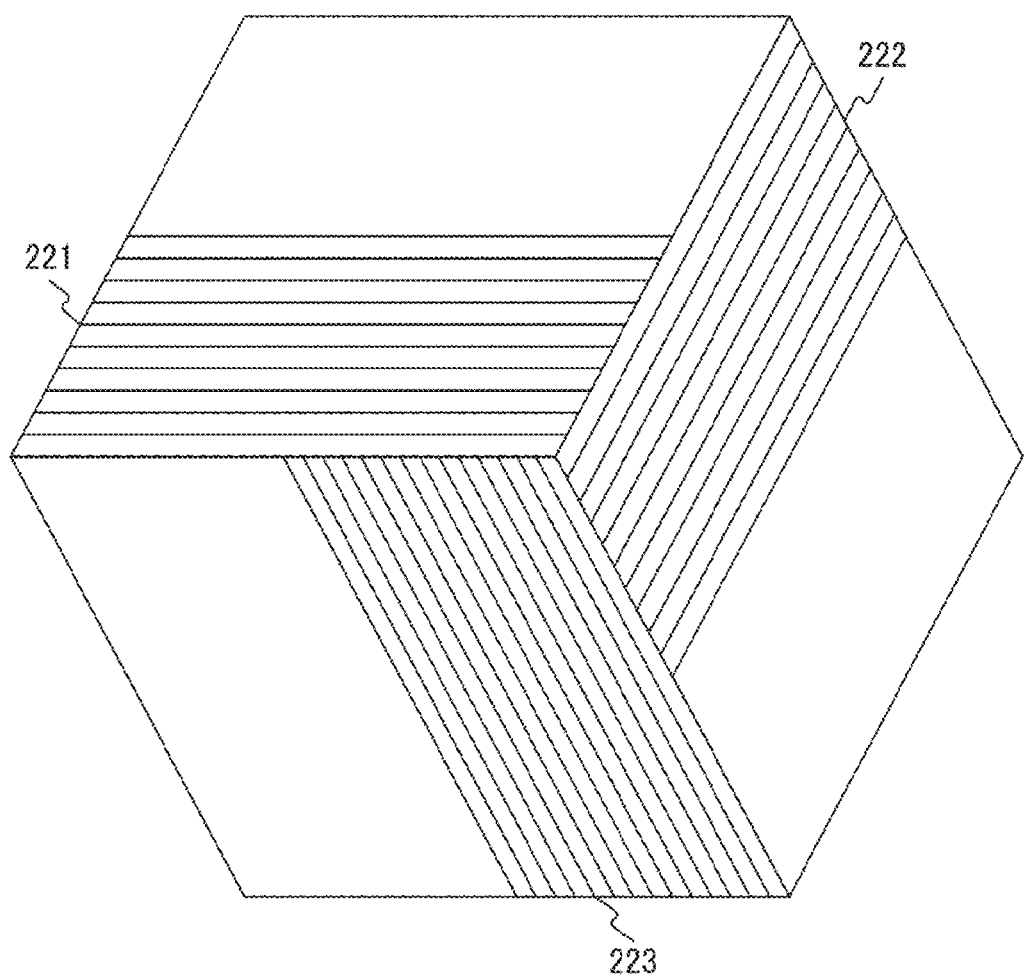
FIG. 14 is a top view illustrating a second arrangement example of the polarizer 14 in the seventh embodiment of the present technology.

FIG. 14 is a top view illustrating a second arrangement example of the polarizer 14 in the seventh embodiment of the present technology.

In the second arrangement example of the seventh embodiment, similarly to the above-described first arrangement example, three types of polarizing members 221 to 223 are formed by using parallelogram-shaped polarizing members having the same internal structures, and rotationally moving one of the polarizing members. The mode of the rotational movement is also similar to that in the above-described first arrangement example.

In the second arrangement example, adjacent sides of the parallelogram have different lengths. Thus, a gap may be generated when arrangement is made. In that case, it is desirable to arrange a light-shielding film outside the polarizing members 221 to 223. Light can therefore be prevented from being incident on other than the polarizing members 221 to 223.

Figure 15:
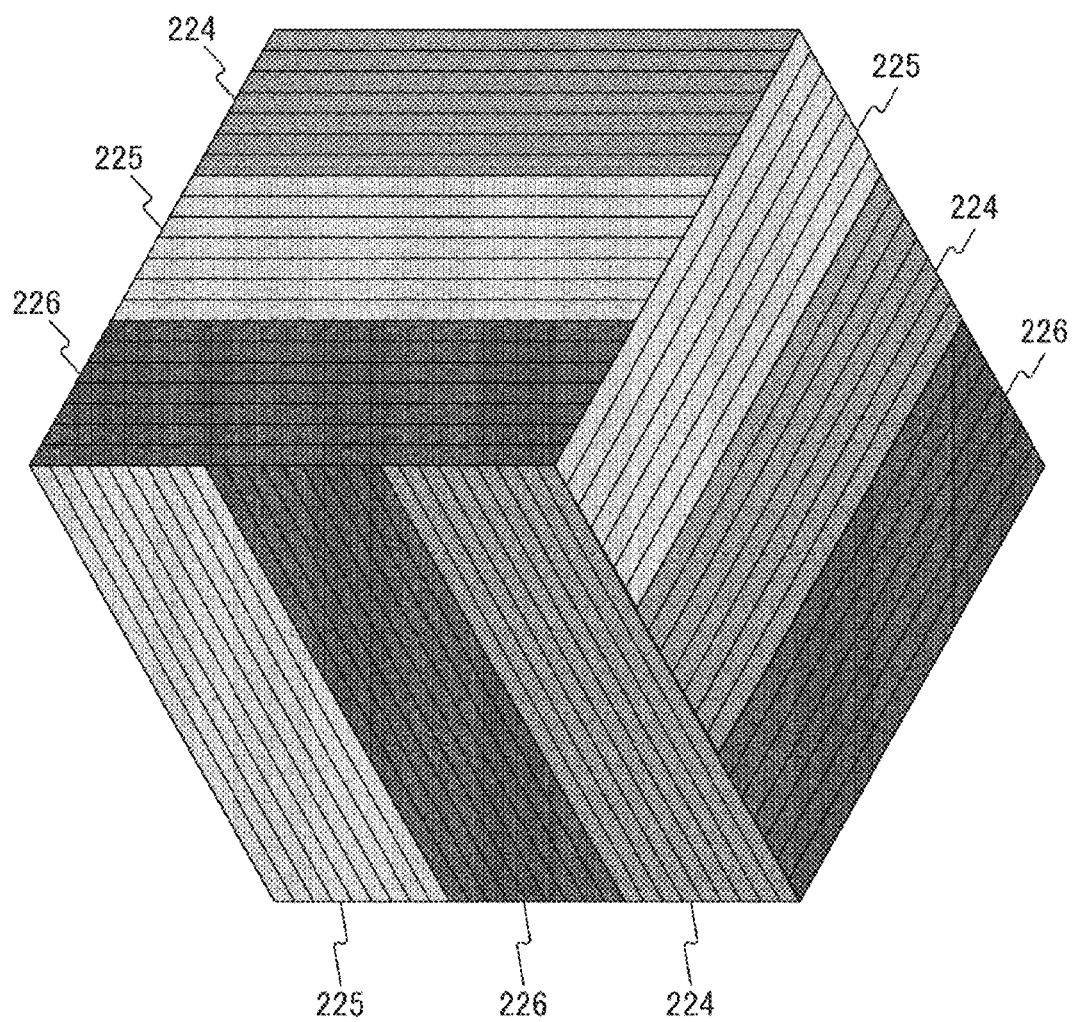
FIG. 15 is a top view illustrating a modification of the second arrangement example of the polarizer 14 in the seventh embodiment of the present technology.

Note that, in a case where a color imaging element is used, it is desirable to arrange different color imaging elements in parallel with the polarizing members 221 to 223. The above-described gap can therefore be eliminated. For example, as illustrated in FIG. 15, it is assumed that imaging elements of blue pixels 224, green pixels 225, and red pixels 226 are arranged.

Furthermore, as described above, in the seventh embodiment, the wire grid is formed parallel to any one side of the parallelogram, but in the second arrangement example, the wire grid is desirably formed parallel to the longer side of the parallelogram.

Figure 16:
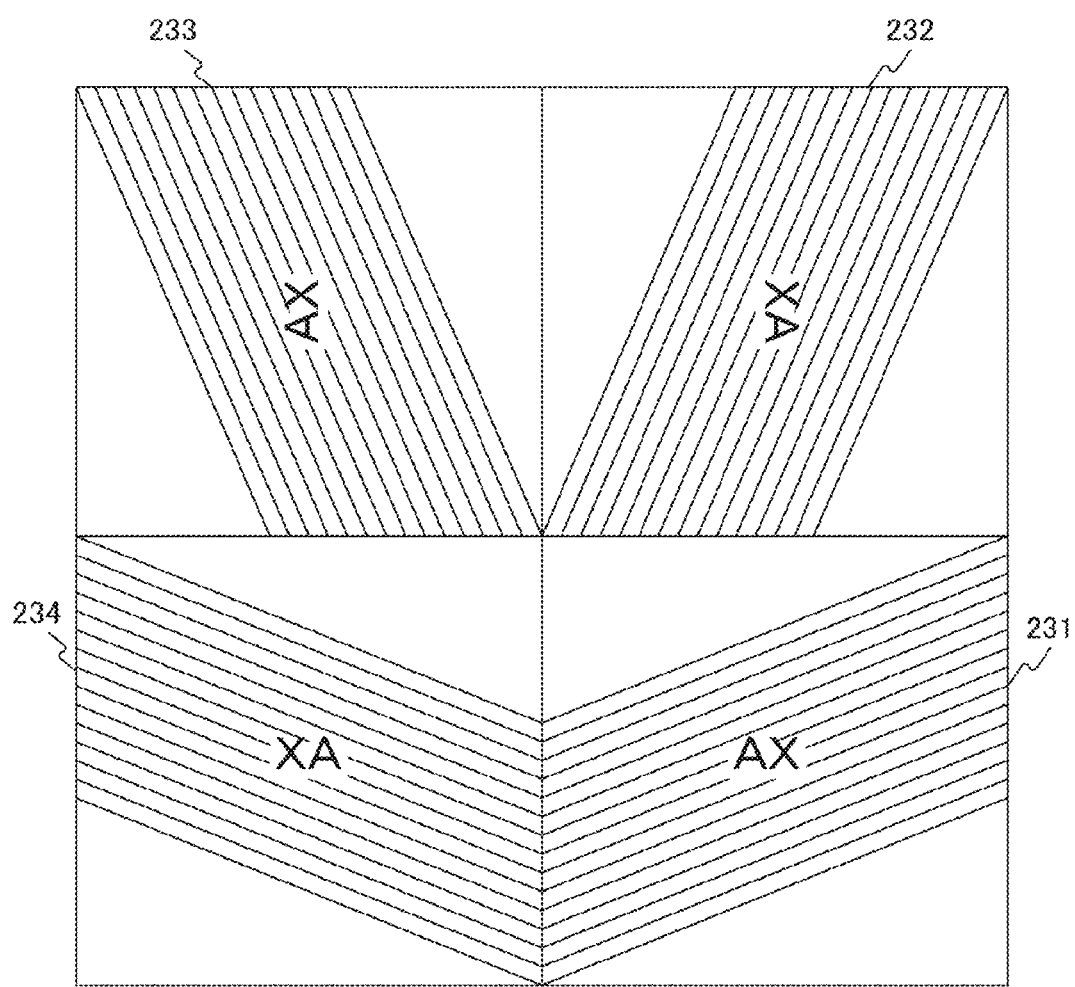
FIG. 16 is a top view illustrating a third arrangement example of the polarizer 14 in the seventh embodiment of the present technology.

FIG. 16 is a top view illustrating a third arrangement example of the polarizer 14 in the seventh embodiment of the present technology.

In the third arrangement example of the seventh embodiment, four types of polarizing members 231 to 234 are formed by using parallelogram-shaped polarizing members having the same internal structures, and rotationally moving one of the polarizing members.

With the first type polarizing member 231 as a reference, the second type polarizing member 232 is obtained by horizontally inverting the first type polarizing member 231, and rotating the inverted second type polarizing member 232 clockwise by 90 degrees. Furthermore, the third type polarizing member 233 is obtained by rotating the first type polarizing member 231 counterclockwise by 90 degrees. Furthermore, the fourth type polarizing member 234 is obtained by horizontally inverting the first type polarizing member 231.

In the third arrangement example, adjacent sides of the parallelogram may have different lengths. In that case, gaps may be formed between the polarizing members 231 to 234, and it is desirable to arrange a light-shielding film outside the polarizing members 231 to 234 similarly to the above-described second arrangement example.

Furthermore, in the third arrangement example, the wire grid is desirably formed parallel to the longer side of the parallelogram similarly to the above-described second arrangement example.

As described above, according to the seventh embodiment of the present technology, by using at least three types of polarizing members obtained by rotationally moving one of the parallelogram-shaped polarizing members having the same internal structures, the characteristics as the polarizing member can be matched with each other, and highly accurate polarization information can be obtained.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that, the present technology can also be configured as described below.

(1) An imaging element including:
a polarizer in which a plurality of types of polarizing members is arranged, the plurality of types of polarizing members each being obtained by rotationally moving or symmetrically moving one of the plurality of types of polarizing members having identical internal structures; and
a photoelectric conversion element that converts light incident through each of the plurality of types of polarizing members into electric charges.

(2) The imaging element according to (1), in which
at least one type of the plurality of types of polarizing members is obtained by at least symmetrically moving another type of the polarizing members.

(3) The imaging element according to (1) or (2), in which
the plurality of types of polarizing members includes: a first type polarizing member; a second type polarizing member obtained by inverting horizontally and rotating clockwise by 90 degrees the first type polarizing member; a third type polarizing member obtained by rotating the first type polarizing member counterclockwise by 90 degrees; and a fourth type polarizing member obtained by inverting horizontally the first type polarizing member.

(4) The imaging element according to (3), in which
a polarization angle of the first type polarizing member is within a range of from 5 degrees to 40 degrees.

(5) The imaging element according to (1), in which
the plurality of types of polarizing members includes: a first type polarizing member; a second type polarizing member obtained by rotating the first type polarizing member counterclockwise by 45 degrees; a third type polarizing member obtained by rotating the first type polarizing member counterclockwise by 90 degrees; and a fourth type polarizing member obtained by rotating the first type polarizing member counterclockwise by 135 degrees.

(6) The imaging element according to (5), in which
area shapes of the plurality of types of polarizing members are regular octagons.

(7) The imaging element according to (5), in which
area shapes of the plurality of types of polarizing members are circles.

(8) The imaging element according to (1), further including a light-shielding film arranged in an area outside the plurality of types of polarizing members.

(9) The imaging element according to any of (1) to (8), further including lenses arranged on an incident side to be respectively inscribed in the plurality of types of polarizing members.

(10) The imaging element according to (1) or (2), in which
the plurality of types of polarizing members includes: a first type polarizing member; a second type polarizing member obtained by rotating the first type polarizing member counterclockwise by 60 degrees; and a third type polarizing member obtained by rotating the first type polarizing member counterclockwise by 120 degrees.

(11) The imaging element according to (10), in which
area shapes of the plurality of types of polarizing members are regular hexagons.

(12) The imaging element according to (1) or (2), in which
the plurality of types of polarizing members includes: a first type polarizing member; a second type polarizing member obtained by inverting horizontally and rotating clockwise by 120 degrees the first type polarizing member; a third type polarizing member obtained by rotating the first type polarizing member counterclockwise by 60 degrees; a fourth type polarizing member obtained by inverting horizontally and rotating clockwise by 60 degrees the first type polarizing member; a fifth type polarizing member obtained by rotating the first type polarizing member counterclockwise by 120 degrees; and a sixth type polarizing member obtained by horizontally inverting the first type polarizing member.

(13) The imaging element according to (1) or (2), in which
in the polarizer, each of the plurality of types of polarizing members is arranged such that area shapes of the plurality of types of polarizing members are to overlap each other by parallel movement.

(14) The imaging element according to (13), in which
when there are n types of angles of rotational movement in the plurality of types of polarizing members, area shapes of the plurality of types of polarizing members are n×m polygons, where n and m are integers.

(15) The imaging element according to (1), in which
the plurality of types of polarizing members is wire grid type polarizing members each having a shape of a parallelogram and a plurality of linear conductive light-shielding material layers parallel to one side of the parallelogram.

(16) The imaging element according to (15), in which
the plurality of linear conductive light-shielding material layers in the plurality of types of polarizing members is parallel to a long side of the parallelogram.

(17) The imaging element according to (15), in which
the plurality of types of polarizing members each has a shape of a parallelogram in which lengths of respective sides are equal to each other, the parallelogram having a combination of interior angles of 60 degrees and 120 degrees.

(18) The imaging element according to (15), in which
the plurality of types of polarizing members is at least three types of polarizing members.

(19) An imaging device in which a plurality of imaging elements is arranged, the plurality of imaging elements each including: a polarizer in which a plurality of types of polarizing members is arranged, the plurality of types of polarizing members each being obtained by rotationally moving or symmetrically moving one of the plurality of types of polarizing members having identical internal structures; and a photoelectric conversion element that converts light incident through each of the plurality of types of polarizing members into electric charges.

REFERENCE SIGNS LIST

10 Pixel area
11 Imaging element
12 Lens
13 Color filter
14 Polarizer
15 Wiring layer
16 Photoelectric conversion element
17 Substrate 19 Vertical signal line
20 Vertical drive circuit
30 Horizontal drive circuit
40 Control circuit
50 Column signal processing circuit
59 Horizontal signal line
60 Output circuit
111 to 114, 121 to 124, 131 to 134, 141 to 144, 151 to 153, 161 to 166, 211 to 213, 221 to 223, 231 to 234 Polarizing member
125, 135 Lens
129, 139, 149 Light-shielding film
136 Transistor
137 Contact

The invention claimed is:

1. An imaging element, comprising:
a polarizer;
a plurality of types of polarizing members on the polarizer, wherein
each of the plurality of types of polarizing members is based on rotational movement or symmetrical movement of one of the plurality of types of polarizing members having identical internal structures, and
at least one type of the plurality of types of polarizing members is based on at least symmetrical movement of a different type of the polarizing members; and
a photoelectric conversion element configured to convert light incident through each of the plurality of types of polarizing members into electric charges.

2. The imaging element according to claim 1, wherein the plurality of types of polarizing members includes:
a first type polarizing member;
a second type polarizing member based on horizontal inversion and clockwise rotation of the first type polarizing member by 90 degrees;
a third type polarizing member based on counterclockwise rotation of the first type polarizing member by 90 degrees; and
a fourth type polarizing member based on horizontal inversion of the first type polarizing member.

3. The imaging element according to claim 2, wherein a polarization angle of the first type polarizing member is within a range of 5 degrees to 40 degrees.

4. The imaging element according to claim 1, wherein the plurality of types of polarizing members includes:
a first type polarizing member;
a second type polarizing member based on counterclockwise rotation of the first type polarizing member by 45 degrees;
a third type polarizing member based on counterclockwise rotation of the first type polarizing member by 90 degrees; and
a fourth type polarizing member based on counterclockwise rotation of the first type polarizing member by 135 degrees.

5. The imaging element according to claim 4, wherein area shapes of the plurality of types of polarizing members are regular octagons.

6. The imaging element according to claim 4, wherein area shapes of the plurality of types of polarizing members are circles.

7. The imaging element according to claim 1, further comprising a light-shielding film in an area outside the plurality of types of polarizing members.

8. The imaging element according to claim 1, further comprising lenses on an incident side, wherein the lenses are respectively inscribed in the plurality of types of polarizing members.

9. The imaging element according to claim 1, wherein the plurality of types of polarizing members includes:
a first type polarizing member;
a second type polarizing member based on counterclockwise rotation of the first type polarizing member by 60 degrees; and
a third type polarizing member based on counterclockwise rotation of the first type polarizing member by 120 degrees.

10. The imaging element according to claim 9, wherein area shapes of the plurality of types of polarizing members are regular hexagons.

11. The imaging element according to claim 1,
the plurality of types of polarizing members includes:
a first type polarizing member;
a second type polarizing member based on horizontal inversion and clockwise rotation of the first type polarizing member by 120 degrees;
a third type polarizing member based on counterclockwise rotation of the first type polarizing member by 60 degrees;
a fourth type polarizing member based on horizontal inversion and clockwise rotation of the first type polarizing member by 60 degrees;
a fifth type polarizing member based on counterclockwise rotation of the first type polarizing member by 120 degrees; and
a sixth type polarizing member based on horizontal inversion of the first type polarizing member.

12. The imaging element according to claim 1, wherein area shapes of the plurality of types of polarizing members overlap each other by parallel movement.

13. The imaging element according to claim 12, wherein
based on n types of angles of rotational movement in the plurality of types of polarizing members, area shapes of the plurality of types of polarizing members are n×m polygons, and
n and m are integers.

14. The imaging element according to claim 1, wherein the plurality of types of polarizing members is wire grid type polarizing members each having a shape of a parallelogram and a plurality of linear conductive light-shielding material layers parallel to one side of the parallelogram.

15. The imaging element according to claim 14, wherein the plurality of linear conductive light-shielding material layers in the plurality of types of polarizing members is parallel to a long side of the parallelogram.

16. The imaging element according to claim 14, wherein
each of the plurality of types of polarizing members has a shape of a parallelogram in which lengths of respective sides are equal to each other, and
the parallelogram has a combination of interior angles of 60 degrees and 120 degrees.

17. The imaging element according to claim 14, wherein the plurality of types of polarizing members is at least three types of polarizing members.

18. An imaging device, comprising:
a plurality of imaging elements, wherein each of the plurality of imaging elements:
a polarizer;
a plurality of types of polarizing members on the polarizer, wherein each of the plurality of types of polarizing members is based on rotational movement or symmetrical movement of one of the plurality of types of polarizing members having identical internal structures, and a photoelectric conversion element configured to convert light incident through each of the plurality of types of polarizing members into electric charges.

\* \* \* \* \*